(12) United States Patent
Jeong (10) Patent No.: US 8,508,284 B2
(45) Date of Patent: Aug. 13, 2013

(54) SEMICONDUCTOR INTEGRATED CIRCUIT HAVING FUSE CIRCUIT AND DRIVING METHOD OF FUSE CIRCUIT

(75) Inventor: Young-Han Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 72 days.

(21) Appl. No.: 13/337,514

(22) Filed: Dec. 27, 2011

(65) Prior Publication Data

US 2013/0135034 A1    May 30, 2013

(30) Foreign Application Priority Data

Nov. 28, 2011    (KR) .......................... 10-2011-0125384

(51) Int. Cl.
*H01H 37/76*    (2006.01)
(52) U.S. Cl.
USPC ........................................................ 327/525
(58) Field of Classification Search
USPC .................................. 327/524, 525
See application file for complete search history.

(56) References Cited

U.S. PATENT DOCUMENTS

| | | | | |
|---|---|---|---|---|
| 5,600,277 A | * | 2/1997 | Koelling | 327/526 |
| 6,566,937 B1 | * | 5/2003 | Mori et al. | 327/525 |
| 7,565,518 B2 | * | 7/2009 | Kuroda | 713/1 |
| 8,274,321 B2 | * | 9/2012 | Chi et al. | 327/525 |

FOREIGN PATENT DOCUMENTS

| | | |
|---|---|---|
| KR | 1020100124506 | 11/2010 |
| KR | 1020110098987 | 9/2011 |
| KR | 1020110108769 | 10/2011 |

OTHER PUBLICATIONS

Notice of Allowance issued by the Korean Intellectual Property Office on Mar. 19, 2013.

* cited by examiner

*Primary Examiner* — Jeffrey Zweizig
(74) *Attorney, Agent, or Firm* — IP & T Group LLP (57) ABSTRACT

A semiconductor integrated circuit includes a fuse connected between a first node and a second node, a first driver configured to pull down a voltage of the first node in an initialization period in response to a fuse sensing signal, a second driver configured to pull up a voltage of the second node in an initial period of a fuse sensing period in response to the fuse sensing signal, a sensor configured to determine whether the fuse is blown or not in response to a voltage of the first node, and a third driver configured to drive the second node to a voltage level lower than a pull-up voltage level of the second driver after the initial period of the fuse sensing period in response to an output signal of the sensor and the fuse sensing signal.

20 Claims, 7 Drawing Sheets

SEMICONDUCTOR INTEGRATED CIRCUIT HAVING FUSE CIRCUIT AND DRIVING METHOD OF FUSE CIRCUIT

CROSS-REFERENCE TO RELATED APPLICATIONS

The present application claims priority of Korean Patent Application No. 10-2011-0125384, filed on Nov. 28, 2011, which is incorporated herein by reference in its entirety.

BACKGROUND

1. Field

Exemplary embodiments of the present invention relate to a semiconductor integrated circuit design technology, and more particularly, to a fuse circuit of a semiconductor integrated circuit.

2. Description of the Related Art

A semiconductor integrated circuit includes circuits that have the same patterns, and redundancy circuits are disposed in the semiconductor integrated circuit so that the semiconductor integrated circuit can properly function even though some circuits failed a test due to process variants.

In particular, in a semiconductor memory device, a great number of memory cells are integrated in one chip. If any one of the memory cells is a memory cell that failed a test, the corresponding memory chip is considered a defective product and does not properly function.

As a semiconductor integrated circuit is highly integrated, an increasing number of memory cells are integrated in a chip with a limited size. In this regard, when any one cell is a memory cell that failed a test and the entire memory chip is considered a defective product, the number of memory chips to be discarded will increase remarkably, and for this reason, a semiconductor memory device may not be mass-produced with economic efficiency.

To address this issue, a conventional semiconductor memory device includes a fuse circuit and a redundancy cell array. The fuse circuit includes a plurality of fuses, and each fuse has the shape of a metal line, and a memory cell that failed a test is replaced with a redundancy cell in a repair process depending upon whether or not a fuse is blown. The redundancy cell array and the fuse circuit are formed during a semiconductor fabrication process. The repair process, which replaces the memory cell that failed a test with the redundancy cell, is performed to selectively cut a fuse formed of a metal line using a laser beam.

Even after the fuse is blown, a failure may occur because the cut fuse may be reconnected due to electrical and chemical migration phenomena by metal ions. Such a failure is generally called a highly accelerated stress testing (HAST) failure. The HAST failure frequently occurs as aluminum is replaced with copper as a material for forming a metal line. The HAST failure mainly occurs when reliability is tested under the condition of high temperature, high voltage, and 100% humidity.

While the HAST failure occurs as copper is used for the fabrication of a semiconductor integrated circuit to operate at a high speed, the HAST failure may also occur where aluminum or other materials are used. Since the HAST failure occurs after a fuse is blown in a repair process, the HAST failure may be difficult to find and repair. The HAST failure is a factor that deteriorates the productivity and reliability of a semiconductor integrated circuit.

Figure 1A:
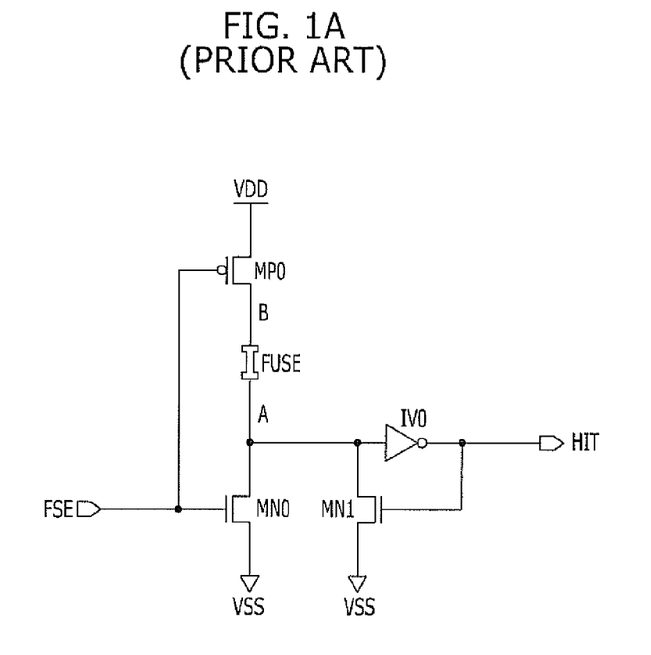
FIG. 1A is a circuit diagram illustrating a fuse circuit of a conventional semiconductor integrated circuit including a fuse that is not blown.
Figure 1B:
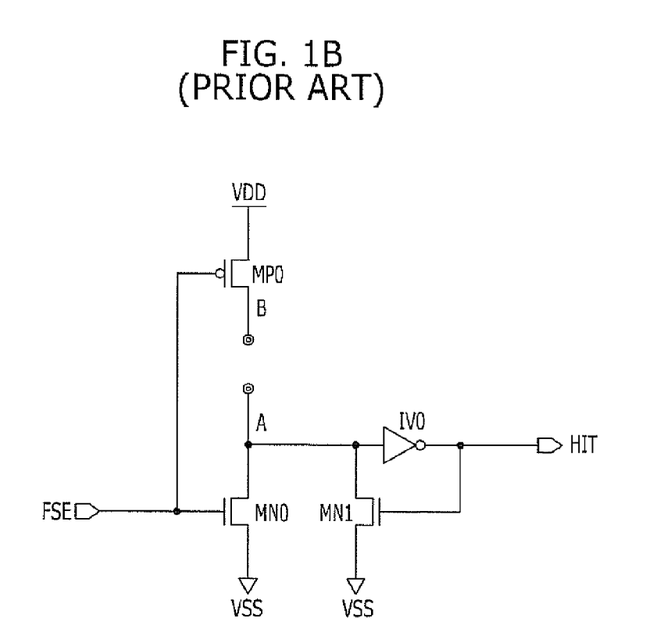
FIG. 1B is a circuit diagram illustrating a fuse circuit of a conventional semiconductor integrated circuit including a fuse that is blown.

FIGS. 1A and 1B are diagrams illustrating a conventional fuse circuit of a semiconductor integrated circuit, wherein FIG. 1A illustrates a semiconductor integrated circuit including a fuse that is not blown and FIG. 1B illustrates a semiconductor integrated circuit including a fuse that is blown.

Referring to FIG. 1A, a conventional fuse circuit of a semiconductor integrated circuit includes an NMOS transistor MN0, a PMOS transistor MP0, a fuse FUSE, an inverter IV0, and another NMOS transistor MN1. The NMOS transistor MN0 has a source that is connected to a ground voltage VSS, a drain that is connected to a sensing node A, and a gate that receives a fuse sensing signal FSE. The PMOS transistor MP0 has a source that is connected to a power source terminal VDD, a drain that is connected to a node B and a gate that receives the fuse sensing signal FSE. The fuse FUSE is connected between the node B and the sensing node A. The inverter IV0 has an input terminal connected to the sensing node A and an output terminal for outputting an output signal HIT. The NMOS transistor MN1 has a source that is connected to the ground voltage VSS, a drain that is connected to the sensing node A, and a gate that receives the output signal HIT.

The NMOS transistor MN1 constitutes an inverting latch together with the inverter IV0.

Figure 2A:
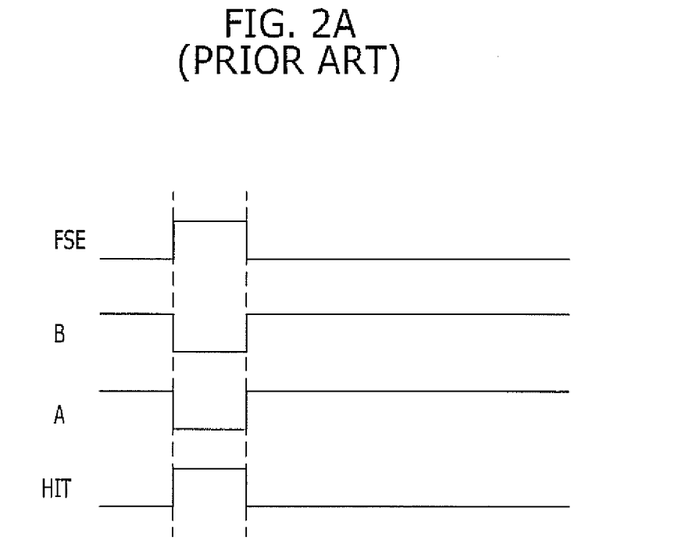
FIG. 2A is a timing diagram of the fuse circuit of FIG. 1A.
Figure 2B:
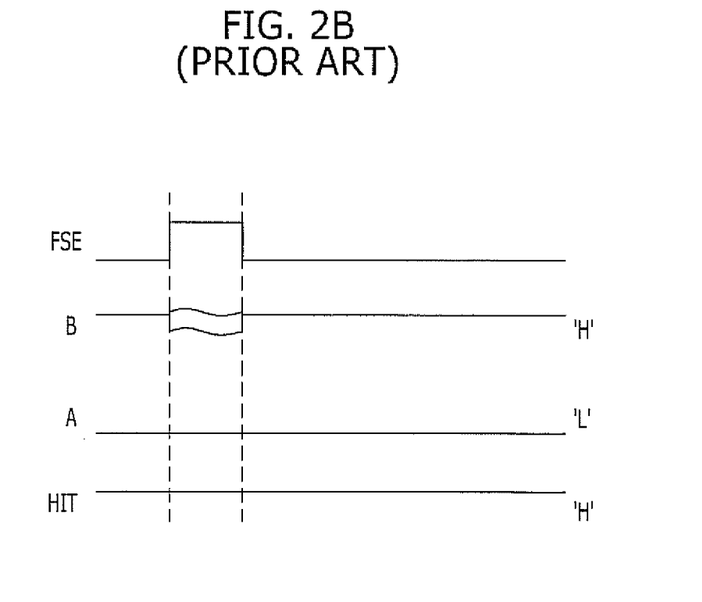
FIG. 2B is a timing diagram of the fuse circuit of FIG. 1B.

Operations of the fuse circuit shown in FIGS. 1A and 1B will be described below. FIG. 2A shows a semiconductor integrated circuit including the fuse that is not blown, and FIG. 2B shows a semiconductor integrated circuit including the fuse that is blown.

First, the fuse sensing signal FSE is at a logic low level and subsequently transitions to a logic high level in an initialization period of the sensing node A. Accordingly, the NMOS transistor MN0 is turned on and discharges the sensing node A, and as a result of discharging the sensing node A, the output signal HIT is outputted at a logic high level. The NMOS transistor MN1 constituting the latch is turned on so that the state of the sensing node A is maintained.

Thereafter, when the fuse sensing signal FSE is enabled to a logic low level, the NMOS transistor MN0 is turned off, and the PMOS transistor MP0 is turned on. Here, a fuse state is decided by the pull-down capability of the NMOS transistor MN1 for maintaining the initial state and the pull-up capability of the PMOS transistor MP0 and the fuse FUSE. When the fuse FUSE is not blown (see FIG. 1A and FIG. 2A), the sensing node A is driven to the power source voltage VDD through the PMOS transistor MP0 and the fuse FUSE. Transition of the sensing node A is determined in response to the ratio between the effective resistance of a pull-up device and the effective resistance of a pull-down device. If the voltage level of the sensing node A rises higher than the threshold logic voltage of the inverter IV0, the output signal HIT transitions to a logic low level, and as the output signal HIT is fed back, the NMOS transistor MN1 of the pull-down device is turned off, stabilizing the voltage of the sensing node A. As a result, the output signal HIT becomes a logic low level.

Conversely, when the fuse FUSE is blown (see FIG. 1B and FIG. 2B), since the fuse FUSE is in a blown state, the output signal HIT maintains a logic high level, which is the initial logic level even though the PMOS transistor MP0 is in a turned-on state.

The following Table 1 represents logic level changes in the respective nodes of the fuse circuits shown in FIGS. 1A and 1B depending upon the fuse sensing signal FSE and the state of the fuse FUSE. The logic level changes are the same as described in the above explanation of the operations.

TABLE 1

|  | FSE | H | L |
|---|---|---|---|
| Fuse Not Cut | Node B | L | H |
|  | Node A | L | H |
|  | HIT | H | L |
| Fuse Cut | Node B | Floating | H |
|  | Node A | L | L |
|  | HIT | H | H |

Referring to Table 1, where the fuse sensing signal FSE is enabled to a logic low level, the logic level of the output signal HIT changes depending upon whether the fuse FUSE is cut or not.

However, when the fuse FUSE is cut, a voltage of VDD-VSS is applied between node B and the sensing node A, which are both ends of the fuse FUSE, when the fuse sensing signal FSE has a logic low level, and a corresponding electric field promotes the electrical and chemical migration phenomena of metal ions as mentioned above.

The electrical and chemical migration phenomena of the metal ions cause the cut fuse FUSE to be reconnected, which reverses a fuse programming result and leads to an error in the operation of the integrated circuit.

SUMMARY

An embodiment of the present invention is directed to a semiconductor integrated circuit that may prevent the electrical and chemical migration phenomena of metal ions that constitute a fuse, and a method for driving the fuse circuit.

In accordance with an embodiment of the present invention, a semiconductor integrated circuit includes: a fuse connected between a first node and a second node; a first driver configured to pull down a voltage of the first node in an initialization period in response to a fuse sensing signal; a second driver configured to pull up a voltage of the second node in an initial period of a fuse sensing period in response to the fuse sensing signal; a sensor configured to determine whether the fuse is blown or not in response to a voltage of the first node; and a third driver configured to drive the second node to a voltage level lower than a pull-up voltage level of the second driver after the initial period of the fuse sensing period in response to an output signal of the sensor and the fuse sensing signal.

In accordance with another embodiment of the present invention, a semiconductor integrated circuit includes: a fuse connected between a first node and a second node; a first driver configured to pull down a voltage of the first node in an initialization period in response to a fuse sensing signal; a second driver configured to pull down a voltage of the second node in an initial period of a fuse sensing period in response to the fuse sensing signal; a sensor configured to determine whether the fuse is blown or not in response to a voltage of the first node; and a third driver configured to drive the second node toward a ground voltage after the initial period of the fuse sensing period in response to an output signal of the sensor and the fuse sensing signal.

In accordance with another embodiment of the present invention, a semiconductor integrated circuit includes: a fuse connected between a first node and a second node; an initialization driver configured to pull down a voltage of the first node in an initialization period in response to a fuse sensing signal; a pulse generator configured to receive the fuse sensing signal and generate a fuse sensing pulse that is enabled for an initial period of a fuse sensing period; a pull-up driver configured to pull up a voltage of the second node in response to the fuse sensing pulse; a sensor configured to determine whether the fuse is blown or not in response to a voltage of the first node; a logic operator configured to perform a logic operation on an output signal of the sensor and the fuse sensing signal; and a ground voltage driver configured to drive the second node toward a ground voltage in response to an output signal of the logic operator.

In accordance with another embodiment of the present invention, a method for driving a fuse circuit including a fuse connected between a first node and a second node includes: pulling down a voltage of the first node in an initialization period; pulling up a voltage of the second node in an initial period of a fuse sensing period; determining whether the fuse is blown or not in response to a voltage of the first node in the fuse sensing period to produce a sensing result; and driving the second node toward a voltage level lower than a pull-up voltage level of the second node in response to the sensing result after the initial period of the fuse sensing period.

In accordance with another embodiment of the present invention, a semiconductor integrated circuit includes: a fuse connected between a first node and a second node; a first driver configured to pull down a voltage of the first node in an initialization period in response to a fuse sensing signal; a second driver configured to pull up a voltage of the second node in an initial first period of a fuse sensing period in response to the fuse sensing signal; a sensor configured to determine whether the fuse is blown or not in response to a voltage of the first node; a delayed fuse sensing signal generator configured to generate a delayed fuse sensing signal by delaying an enabling edge of the fuse sensing signal up to an initial second period of the fuse sensing period that includes the initial first period; and a third driver configured to drive the second node to a voltage level lower than a pull-up voltage level of the second driver in response to the delayed fuse sensing signal.

In accordance with another embodiment of the present invention, a semiconductor integrated circuit includes: a fuse connected between a first node and a second node; an initialization driver configured to pull down a voltage of the first node in an initialization period in response to a fuse sensing signal; a pulse generator configured to receive the fuse sensing signal and generate a fuse sensing pulse that is enabled for an initial first period of a fuse sensing period; a pull-up driver configured to pull up a voltage of the second node in response to the fuse sensing pulse; a sensor configured to determine whether the fuse is blown or not in response to a voltage of the first node; a delayed fuse sensing signal generator configured to generate a delayed fuse sensing signal by delaying an enabling edge of the fuse sensing signal up to an initial second period of the fuse sensing period that includes the initial first period; a voltage divider configured to divide a pull-up voltage of the pull-up driver and output a divided voltage; and a divided voltage driver configured to drive the second node toward the divided voltage level in response to the delayed fuse sensing signal.

In accordance with another embodiment of the present invention, a method for driving a fuse circuit which includes a fuse connected between a first node and a second node includes: pulling down a voltage of the first node in an initialization period; pulling up a voltage of the second node during an initial first period of a fuse sensing period; determining whether the fuse is blown or not in response to a voltage of the first node in the fuse sensing period; driving the second node to a voltage level lower than a pull-up voltage level of the second node after an initial second period of the fuse sensing period that includes the initial first period.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
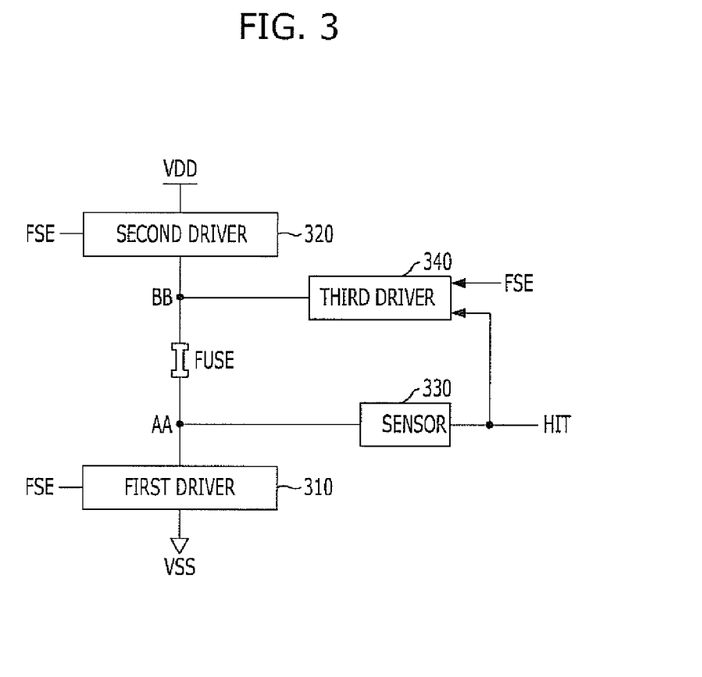
FIG. 3 is a block diagram illustrating a fuse circuit of a semiconductor integrated circuit in accordance with an embodiment of the present invention.

FIG. 3 is a block diagram illustrating a fuse circuit of a semiconductor integrated circuit in accordance with an embodiment of the present invention.

Referring to FIG. 3, the fuse circuit of the semiconductor integrated circuit in accordance with the embodiment of the present invention includes a fuse FUSE, a first driver 310, a second driver 320, a sensor 330, and a third driver 340. The fuse FUSE is connected between a sensing node AA and a node BB. The first driver 310 pull down a voltage of the sensing node AA in an initialization period in response to a fuse sensing signal FSE. The second driver 320 pull up a voltage of the node BB in an initial period of a fuse sensing period in response to the fuse sensing signal FSE. The sensor 330 senses the programming state of the fuse FUSE, more specifically, whether the fuse FUSE is cut or not, in response to the voltage of the sensing node AA. The third driver 340 drives the node BB to a voltage level, such as a VSS level, lower than a pull-up voltage, such as a VDD level, after the initial period of the fuse sensing period in response to an output signal HIT of the sensor 330 and the fuse sensing signal FSE.

In the fuse circuit of the semiconductor integrated circuit in accordance with the embodiment of the present invention, the second driver 320 drives the node BB to the pull-up voltage for an initial period in the fuse sensing period. Here, the sensed fuse programming state is maintained and outputted by the sensor 330. Meanwhile, after the initial period of the fuse sensing period, the second driver 320 ceases to drive the node BB to the pull-up voltage, and the third driver 340 drives the node BB to a voltage level, such as a VSS voltage, lower than a pull-up voltage, such as a VDD voltage, in response to the precondition that the fuse is cut.

As a result, a smaller electric field than VDD-VSS is applied between the sensing node AA and the node BB, and a failure caused by the electrical and chemical migration phenomena of metal ions that constitute the fuse may be prevented.

Figure 4:
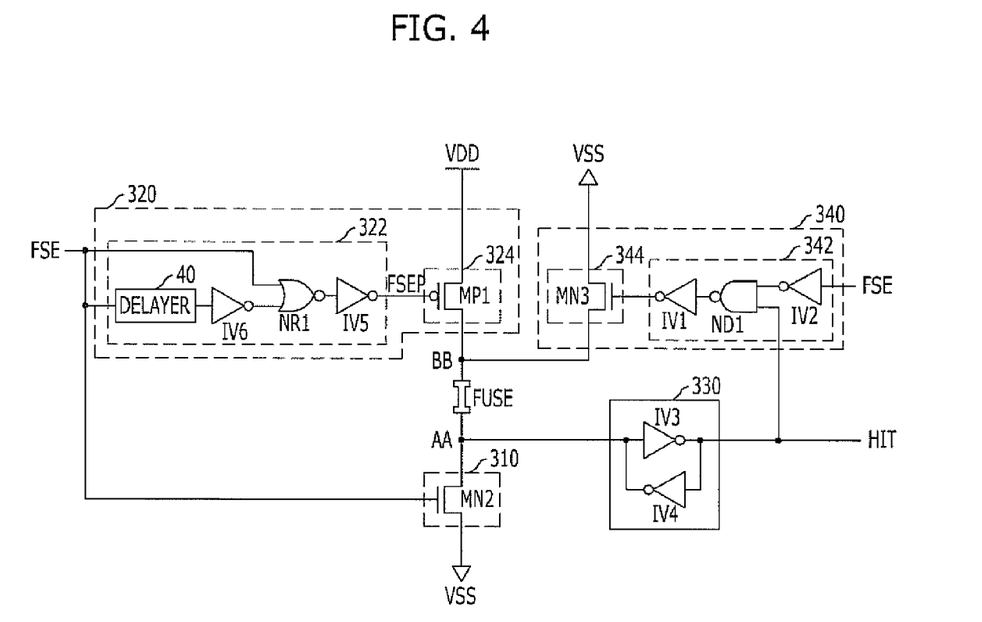
FIG. 4 is a circuit diagram of the fuse circuit illustrated in FIG. 3.

FIG. 4 is a circuit diagram of the fuse circuit illustrated in FIG. 3.

Referring to FIG. 4, the second driver 320 includes a pulse generation unit 322 and a pull-up driving unit 324. The pulse generation unit 322 receives the fuse sensing signal FSE and generates a fuse sensing pulse FSEP that is enabled during an initial period of the fuse sensing period. The pull-up driving unit 324 pulls up a voltage of the node BB in response to the fuse sensing pulse FSEP.

The third driver 340 includes a logic operation unit 342 and a ground voltage driving unit 344. The logic operation unit 342 performs a logical operation on the output signal HIT of the sensor 330 and the fuse sensing signal FSE. The ground voltage driving unit 344 drives the node BB toward a ground voltage VSS voltage in response to an output signal of the logic operation unit 342.

Additionally, the first driver 310 may include an NMOS transistor MN2 that has a source connected to a ground voltage VSS, a drain connected to the sensing node AA, and a gate receiving the fuse sensing signal FSE.

Also, the sensor 330 may include an inverter IV3 having the sensing node AA as an input terminal, and the inverter IV3 outputs the output signal HIT, and an inverter IV4 receiving the output signal HIT and having the sensing node AA as an output terminal. The inverter IV3 and the inverter IV4 may constitute an inverting latch. In another embodiment, the sensor 330 may include an inverter and an NMOS transistor as illustrated in FIG. 1A.

The pulse generation unit 322 may include a delayer 40, an inverter IV6, a NOR gate NR1, and an inverter IV5. The delayer 40 delays the fuse sensing signal FSE by a designated time tD and outputs a delayed signal. The inverter IV6 receives the output signal of the delayer 40. The NOR gate NR1 receives the output signal of the inverter IV6 and the fuse sensing signal FSE. The inverter IV5 receives the output signal of the NOR gate NR1 and outputs the fuse sensing pulse FSEP.

Also, the pull-up driving unit 324 of the second driver 320 may include a PMOS transistor MP1 that has a source connected to a power source voltage VDD terminal, a drain connected to the node BB, and a gate receiving the fuse sensing pulse FSEP.

The logic operation unit 342 of the third driver 340 may include an inverter IV2, a NAND gate ND1, and an inverter IV1. The inverter IV2 receives the fuse sensing signal FSE. The NAND gate ND1 receives the output signal HIT of the sensor 330 and the output signal of the inverter IV2. The inverter IV1 receives the output signal of the NAND gate ND1.

Also, the ground voltage driving unit 344 of the third driver 340 includes a source connected to a ground voltage VSS terminal, a drain connected to the node BB, and a gate receiving the output signal CC of the logic operation unit 342.

Figure 5A:
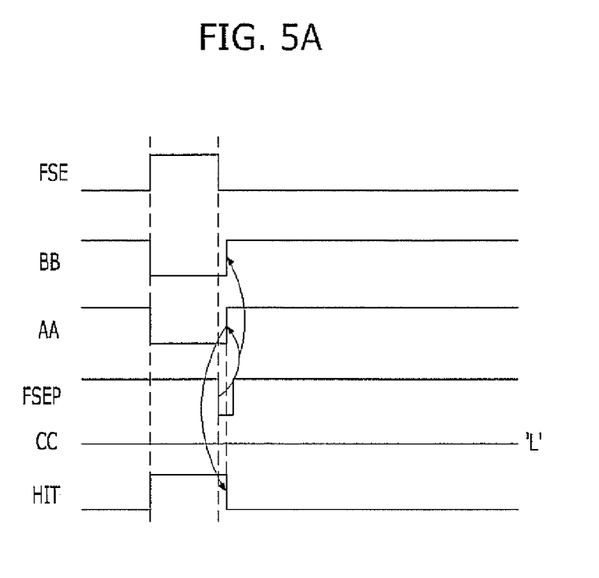
FIG. 5A is a timing diagram of the fuse circuit shown in FIG. 4 including a fuse that is not blown.
Figure 5B:
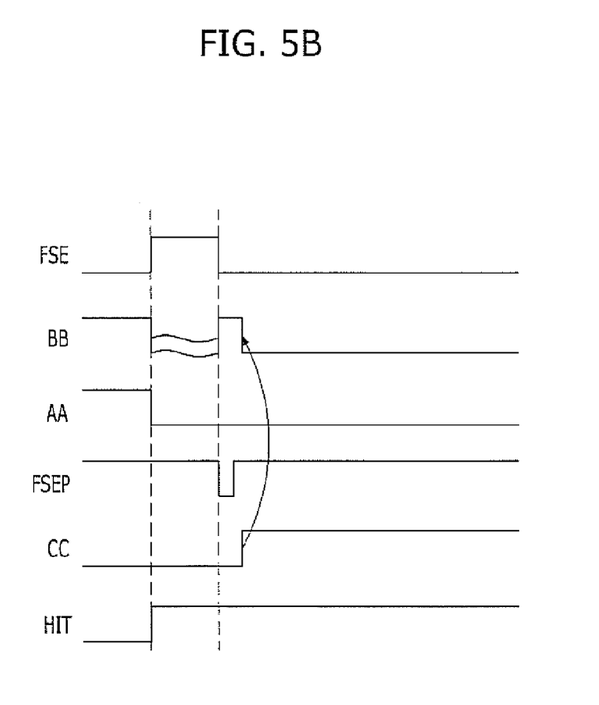
FIG. 5B is a timing diagram of the fuse circuit shown in FIG. 4 including a fuse that is blown.

FIG. 5A is a timing diagram of the fuse circuit shown in FIG. 4 including a fuse that is not blown, and FIG. 5B is a timing diagram of the fuse circuit shown in FIG. 4 including a fuse that is blown.

The fuse sensing signal FSE is at a logic low level and transitions to a logic high level in the initialization period of the sensing node AA. Here, the NMOS transistor MN2 is turned on to discharge the sensing node AA, and the output signal HIT is outputted at a logic high level after the sensing node AA is discharged. The inverter IV4 that constitutes the inverting latch maintains the state of the sensing node AA.

Subsequently, when the fuse sensing signal FSE is enabled to a logic low level in the fuse sensing period, the fuse sensing pulse FSEP outputted from the pulse generation unit 322 of the second driver 320 is pulsed by the designated time tD of the delayer 40. Therefore, the NMOS transistor MN2 is turned off and a PMOS transistor MP1 is turned on.

First, when the fuse FUSE is not blown (see FIG. 5A), the sensing node AA is driven at the power source voltage VDD through the PMOS transistor MN and the fuse FUSE. Transition of the sensing node AA is determined in response to the resistance ratio of an effective resistance of a pull-up device, e.g., the fuse FUSE of the PMOS transistor MP1, and an effective resistance of a pull-down device, e.g., the NMOS transistor of the inverter IV4. When the voltage level of the sensing node AA is increased higher than a threshold logic level of the inverter IV3, the output signal HIT transitions to a logic low level, and the inverter IV4 inverts the output signal HIT to stabilize the voltage of the sensing node AA. After all, the output signal HIT transitions to a logic low level, and the fuse sensing pulse FSEP transitions to a logic high level so that although the PMOS transistor MP1 is turned off, the output signal HIT maintains the voltage. Meanwhile, since the fuse sensing signal FSE is at a logic low level and the output signal HIT is at a logic low level, the output signal CC of the logic operation unit 342 continues to be at a logic low level. Therefore, the NMOS transistor MN3 of the ground voltage driving unit 344 is turned off, thus the node BB is not driven toward the ground voltage.

Subsequently, when the fuse FUSE is blown (see FIG. 5B) and the fuse sensing pulse FSEP is pulsed to a logic low level, the PMOS transistor MP1 is turned on, but since the fuse FUSE is blown, the state of the sensing node AA is not changed and the output signal HIT maintains the initial logic level, which is a logic high level. Meanwhile, since the fuse sensing signal FSE is at a logic low level and the output signal HIT is at a logic high level, the output signal CC of the logic operation unit 342 transitions to a logic high level. Therefore, the NMOS transistor MN3 of the ground voltage driving unit 344 is turned on to drive the node BB toward the ground voltage VSS.

As a result, since the ground voltage driving unit 344 drives the node BB toward the ground voltage VSS level when the fuse FUSE is blown, the ground voltage VSS is applied to both ends of the fuse FUSE to prevent the electrical and chemical migration phenomena of metal ions that reconnects the fuse in response to a high electric field.

Meanwhile, the node BB may be maintained at a high logic level during a portion of the initial period of the fuse sensing period where the node BB is not driven toward the ground voltage VSS.

Figure 6:
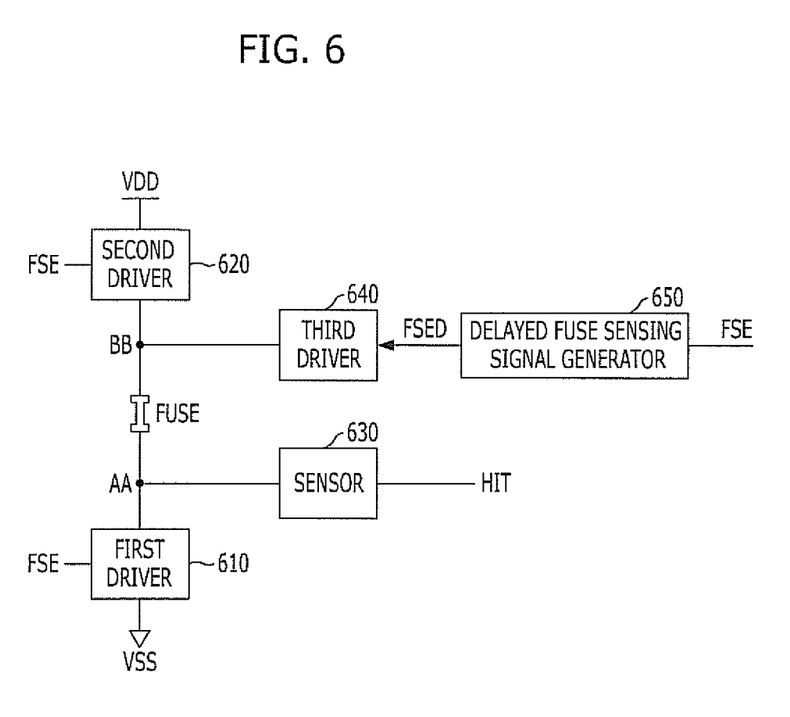
FIG. 6 is a block diagram of a fuse circuit of a semiconductor integrated circuit in accordance with another embodiment of the present invention.

FIG. 6 is a block diagram of a fuse circuit of a semiconductor integrated circuit in accordance with another embodiment of the present invention.

Referring to FIG. 6, the fuse circuit of the semiconductor integrated circuit in accordance with the embodiment of the present invention includes a fuse FUSE, a first driver 610, a second driver 620, a sensor 630, a delayed fuse sensing signal generator 650, and a third driver 640. The fuse FUSE is connected between a sensing node AA and a node BB. The first driver 610 pulls down a voltage of the sensing node AA in an initialization period in response to a fuse sensing signal FSE. The second driver 620 pulls down a voltage of the node BB in an initial first period of a fuse sensing period in response to the fuse sensing signal FSE. The sensor 630 senses the programming state of the fuse FUSE, more specifically, whether the fuse FUSE is cut or not, in response to the voltage of the sensing node AA. The delayed fuse sensing signal generator 650 generates a delayed fuse sensing signal FSED by delaying the enabling edge of the fuse sensing signal FSE by an initial second period (which includes the initial first period) of the fuse sensing period. The third driver 640 drives the node BB to a lower voltage level than a pull-up voltage, such as a VDD voltage, after the initial second period of the fuse sensing period in response to the delayed fuse sensing signal FSED.

In the fuse circuit of the semiconductor integrated circuit in accordance with the embodiment of the present invention, the second driver 620 pulls up a voltage of the node BB for the initial first period of the fuse sensing period. Here, the sensed fuse programming state is maintained and outputted by the sensor 630. Meanwhile, after the initial second period of the fuse sensing period, the second driver 620 ceases to drive the node BB to the pull-up voltage, and the third driver 640 drives the node BB to a voltage level lower than a pull-up voltage, such as a VDD voltage.

As a result, a smaller electric field than VDD-VSS is applied between the sensing node AA and the node BB, and a failure caused by the electrical and chemical migration phenomena of metal ions that constitute the fuse may be prevented.

Figure 7:
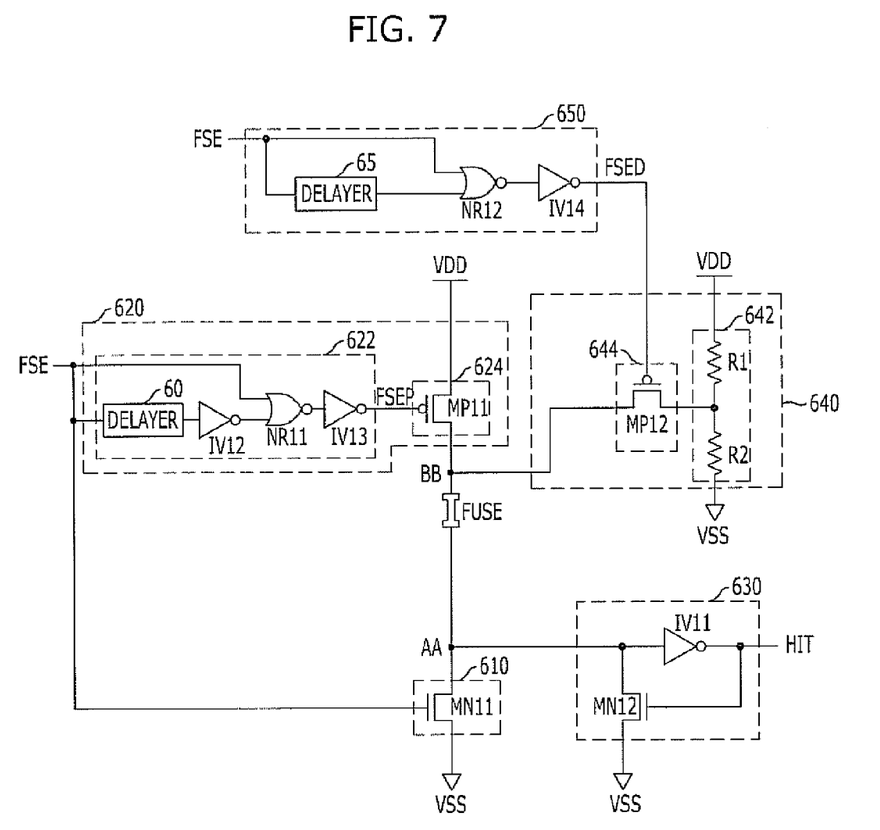
FIG. 7 is a circuit diagram of the fuse circuit illustrated in FIG. 6.

FIG. 7 is a circuit diagram of the fuse circuit illustrated in FIG. 3.

Referring to FIG. 7, the second driver 620 includes a pulse generation unit 622 and a pull-up driving unit 624. The pulse generation unit 622 receives the fuse sensing signal FSE and generates a fuse sensing pulse FSEP that is enabled during the initial first period of the fuse sensing period. The pull-up driving unit 624 pulls up a voltage of the node BB in response to the fuse sensing pulse FSEP.

The third driver 640 includes a voltage dividing unit 642 and a divided voltage driving unit 644. The voltage dividing unit 642 divides the power source voltage VDD and outputs a divided voltage that is lower than the power source voltage VDD. The divided voltage driving unit 644 drives the node BB toward the divided voltage in response to the delayed fuse sensing signal FSED.

Additionally, the first driver 610 may include an NMOS transistor MN11 that has a source connected to a ground voltage VSS, a drain connected to the sensing node AA, and a gate receiving the fuse sensing signal FSE.

Also, the sensor 630 may include an inverter IV1 having the sensing node AA as an input terminal and outputs an output signal HIT and an NMOS transistor MN12 that has a source connected to the ground voltage VSS, a drain connected to the sensing node AA, and a gate receiving the output signal HIT. In another embodiment, the NMOS transistor MN12 may include an inverter that receives the output signal HIT and has the sensing node AA as an output terminal.

The pulse generation unit 622 of the second driver 620 may include a delayer 60, an inverter IV16, a NOR gate NR11, and an inverter IV13. The delayer 60 delays the fuse sensing signal FSE by a designated time tD1 and outputs a delayed signal. The inverter IV12 receives the output signal of the delayer 60. The NOR gate NR11 receives the output signal of the inverter IV12 and receives the fuse sensing signal FSE. The inverter IV13 receives the output signal of the NOR gate NR11 and outputs the fuse sensing pulse FSEP.

Also, the pull-up driving unit 624 of the second driver 620 may include a PMOS transistor MP11 that has a source connected to a power source voltage VDD terminal, a drain connected to the node BB, and a gate receiving the fuse sensing pulse FSEP.

The voltage dividing unit 642 of the third driver 640 may include a first resistor R1 and a second resistor R2 that are serially connected between the power source voltage VDD and the ground voltage VSS.

Also, the divided voltage driving unit 644 of the third driver 640 may include a PMOS transistor MP12 that includes a source connected to the voltage dividing unit 642, a drain connected to the node BB, and a gate receiving the delayed fuse sensing signal FSED.

Also, the delayed fuse sensing signal generator 650 may include a delayer 65, a NOR gate NR1, and an inverter IV14. The delayer 65 delays and outputs the fuse sensing signal FSE by a designated time tD2. The NOR gate NR1 receives the output signal of the delayer 65 and the fuse sensing signal FSE. The inverter IV14 receives the output signal of the NOR gate NR1 and outputs the delayed fuse sensing signal FSED.

Figure 8A:
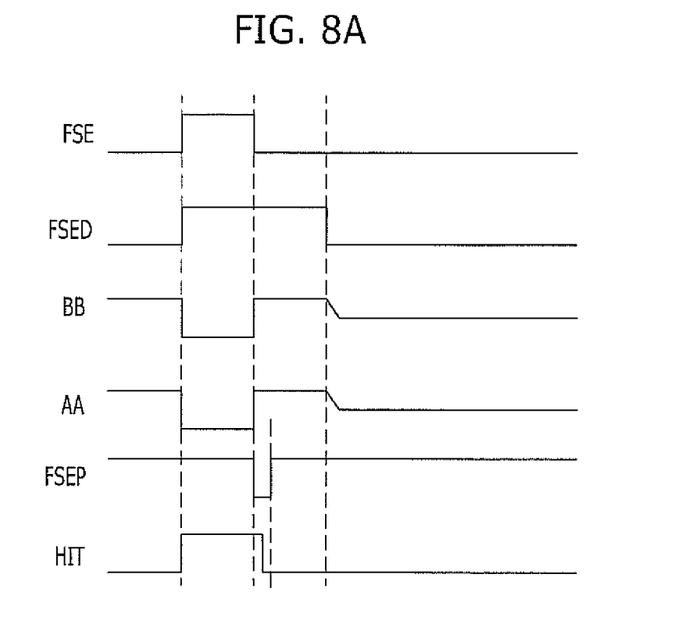
FIG. 8A is a timing diagram of the fuse circuit shown in FIG. 7 including a fuse that is not blown.
Figure 8B:
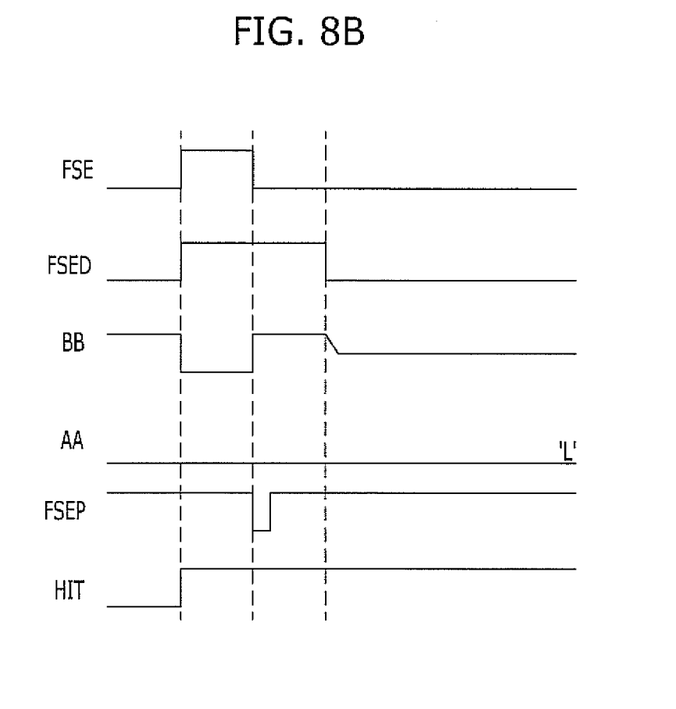
FIG. 8B is a timing diagram of the fuse circuit shown in FIG. 7 including a fuse that is blown.

FIG. 8A is a timing diagram of the fuse circuit shown in FIG. 7 including a fuse that is not blown, and FIG. 8B is a timing diagram of the fuse circuit shown in FIG. 7 including a fuse that is blown.

The fuse sensing signal FSE is at a logic low level and transitions to a logic high level in the initialization period of the sensing node AA. Here, the NMOS transistor MN11 is turned on to discharge the sensing node AA, and the output signal HIT is outputted at a logic high level after the sensing node AA is discharged. The NMOS transistor MN12 that constitutes a latch maintains the state of the sensing node AA.

Subsequently, when the fuse sensing signal FSE is enabled to a logic low level in the fuse sensing period, the fuse sensing pulse FSEP outputted from the pulse generation unit 622 of the second driver 620 is pulsed by the designated time tD1 of the delayer 60. Therefore, the NMOS transistor MN11 is turned off and a PMOS transistor MP11 is turned on.

First, when the fuse FUSE is not blown (see FIG. 8A), the sensing node AA is driven at the power source voltage VDD through the PMOS transistor MP11 and the fuse FUSE. Transition of the sensing node AA is determined in response to the resistance ratio of an effective resistance of a pull-up device, e.g., the fuse FUSE of the PMOS transistor MP11, and an effective resistance of a pull-down device, e.g., the NMOS transistor MN12. When the voltage level of the sensing node AA is increased higher than a threshold logic level of the inverter IV11, the output signal HIT transitions to a logic low level.

Subsequently, the fuse sensing pulse FSEP transitions to a logic high level and the delayed fuse sensing signal FSED is enabled to a logic low level after a designated time, the PMOS transistor MP12 is turned on to drive the node BB at the divided voltage level. The voltage of the divided voltage is R1*VDD/(R1+R2). Here, the sensing node AA is dropped to a voltage as low as R1*VDD/(R1+R2), but the dropped value does not change the output signal HIT of the inverter IV11. Therefore, the output signal HIT is maintained at the logic low level.

Subsequently, when the fuse FUSE is blown (see FIG. 8B) and the fuse sensing pulse FSEP is pulsed at a logic low level, the PMOS transistor MP11 is turned on, but since the fuse FUSE is blown, the state of the sensing node AA is not changed and the output signal HIT maintains the initial logic level, which is a logic high level.

Subsequently, the fuse sensing pulse FSEP transitions to a logic high level and the delayed fuse sensing signal FSED is enabled to a logic low level after a designated time, the PMOS transistor MP12 is turned on to drive the node BB toward the divided voltage level. The voltage of the divided voltage is R1*VDD/(R1+R2). Here, since the sensing node AA is at a logic low level, an electric field of R1*VDD/(R1+R2)−VSS is applied to both ends of the fuse FUSE.

As a result, since the divided voltage driving unit 644 drives the node BB at the voltage level of R1*VDD/(R1+R2) when the fuse FUSE is blown, a high electric field like VDD-VSS is not applied to both ends of the fuse FUSE.

According to an embodiment of the present invention, the failure of a semiconductor device caused by the electrical/chemical migration phenomena of metal ions that constitute a fuse may be prevented by designing the fuse so that both ends of the fuse are protected from a high electric field without improving a process or changing the physical shape of the fuse.

While the present invention has been described with respect to the specific embodiments, it will be apparent to those skilled in the art that various changes and modifications may be made without departing from the spirit and scope of the invention as defined in the following claims.

For example, the logic levels illustrated in the above embodiments may be replaced with other logic levels or omitted according to the types of the signals used and enabling level.

Also, in the above embodiments, the power source voltage VDD is used as a pull-up power source and the ground voltage VSS is used as a pull-down power source, but the technology of the present invention may also be applied to a case where the power sources are changed.

What is claimed is:

1. A semiconductor integrated circuit, comprising:
a fuse connected between a first node and a second node;
a first driver configured to pull down a voltage of the first node in an initialization period in response to a fuse sensing signal;
a second driver configured to pull up a voltage of the second node in an initial period of a fuse sensing period in response to the fuse sensing signal;
a sensor configured to determine whether the fuse is blown or not in response to a voltage of the first node; and
a third driver configured to drive the second node to a voltage level lower than a pull-up voltage level of the second driver after the initial period of the fuse sensing period in response to an output signal of the sensor and the fuse sensing signal.

2. A semiconductor integrated circuit, comprising:
a fuse connected between a first node and a second node;
a first driver configured to pull down a voltage of the first node in an initialization period in response to a fuse sensing signal;
a second driver configured to pull up a voltage of the second node in an initial period of a fuse sensing period in response to the fuse sensing signal;
a sensor configured to determine whether the fuse is blown or not in response to a voltage of the first node; and a third driver configured to drive the second node toward a ground voltage after the initial period of the fuse sensing period in response to an output signal of the sensor and the fuse sensing signal.

3. A semiconductor integrated circuit, comprising:
a fuse connected between a first node and a second node;
an initialization driver configured to pull down a voltage of the first node in an initialization period in response to a fuse sensing signal;
a pulse generator configured to receive the fuse sensing signal and generate a fuse sensing pulse that is enabled for an initial period of a fuse sensing period;
a pull-up driver configured to pull up a voltage of the second node in response to the fuse sensing pulse;
a sensor configured to determine whether the fuse is blown or not in response to a voltage of the first node;
a logic operator configured to perform a logic operation on an output signal of the sensor and the fuse sensing signal; and
a ground voltage driver configured to drive the second node toward a ground voltage in response to an output signal of the logic operator.

4. The semiconductor integrated circuit of claim 3, wherein the initialization driver comprises:
a first NMOS transistor that includes a source connected to a ground voltage terminal, a drain connected to the first node, and a gate receiving the fuse sensing signal.

5. The semiconductor integrated circuit of claim 3, wherein the sensor comprises:
a first inverter including an input terminal connected to the first node and configured to output the output signal of the sensor; and
a second inverter configured to receive the output signal of the sensor and including an output terminal connected to the first node.

6. The semiconductor integrated circuit of claim 3, wherein the pulse generator comprises:
a delayer configured to delay the fuse sensing signal by a delay time and output a delayed signal;
a third inverter configured to receive an output signal of the delayer;
a NOR gate configured to receive an output signal of the third inverter and the fuse sensing signal; and
a fourth inverter configured to receive the output signal of the NOR gate and output the fuse sensing pulse.

7. The semiconductor integrated circuit of claim 3, wherein the pull-up driver comprises:
a PMOS transistor that includes a source connected to a power source voltage terminal, a drain connected to the second node, and a gate receiving the fuse sensing pulse.

8. The semiconductor integrated circuit of claim 3, wherein the logic operator comprises:
a fifth inverter configured to receive the fuse sensing signal;
a NAND gate configured to receive the output signal of the sensor and an output signal of the fifth inverter; and
a sixth inverter configured to receive the output signal of the NAND gate.

9. The semiconductor integrated circuit of claim 3, wherein the ground voltage driver comprises:
a second NMOS transistor that includes a source connected to a ground voltage terminal, a drain connected to the second node, and a gate receiving an output signal of the logic operator.

10. A method for driving a fuse circuit including a fuse connected between a first node and a second node, comprising:

pulling down a voltage of the first node in an initialization period;
pulling up a voltage the second node in an initial period of a fuse sensing period;
determining whether the fuse is blown or not in response to a voltage of the first node in the fuse sensing period to produce a sensing result; and
driving the second node toward a voltage level lower than a pull-up voltage level of the second node in response to the sensing result after the initial period of the fuse sensing period.

11. The method of claim 10, wherein the voltage level lower than the pull-up voltage level of the second node is a ground voltage.

12. A semiconductor integrated circuit, comprising:
a fuse connected between a first node and a second node;
a first driver configured to pull down a voltage of the first node in an initialization period in response to a fuse sensing signal;
a second driver configured to pull up a voltage of the second node in an initial first period of a fuse sensing period in response to the fuse sensing signal;
a sensor configured to determine whether the fuse is blown or not in response to a voltage of the first node;
a delayed fuse sensing signal generator configured to generate a delayed fuse sensing signal by delaying an enabling edge of the fuse sensing signal up to an initial second period of the fuse sensing period that includes the initial first period; and
a third driver configured to drive the second node to a voltage level lower than a pull-up voltage level of the second driver in response to the delayed fuse sensing signal.

13. A semiconductor integrated circuit, comprising:
a fuse connected between a first node and a second node;
an initialization driver configured to pull down a voltage of the first node in an initialization period in response to a fuse sensing signal;
a pulse generator configured to receive the fuse sensing signal and generate a fuse sensing pulse that is enabled for an initial first period of a fuse sensing period;
a pull-up driver configured to pull up a voltage of the second node in response to the fuse sensing pulse;
a sensor configured to determine whether the fuse is blown or not in response to a voltage of the first node;
a delayed fuse sensing signal generator configured to generate a delayed fuse sensing signal by delaying an enabling edge of the fuse sensing signal up to an initial second period of the fuse sensing period that includes the initial first period;
a voltage divider configured to divide a pull-up voltage of the pull-up driver and output a divided voltage; and
a divided voltage driver configured to drive the second node toward the divided voltage level in response to the delayed fuse sensing signal.

14. The semiconductor integrated circuit of claim 13, wherein the voltage divider comprises a first resistor and a second resistor that are serially connected between a power source voltage terminal and a ground voltage terminal.

15. The semiconductor integrated circuit of claim 13, wherein the divided voltage driver comprises:
a first PMOS transistor that includes a source connected to a divided voltage terminal, a drain connected to the second node, and a gate receiving the delayed fuse sensing signal.

16. The semiconductor integrated circuit of claim 13, wherein the delayed fuse sensing signal generator comprises:

a first delayer configured to delay the fuse sensing signal by a first delay time and output a delayed signal;

a first NOR gate configured to receive an output signal of the first delayer and the fuse sensing signal; and a first inverter configured to receive an output signal of the first NOR gate and output the delayed fuse sensing signal.

17. The semiconductor integrated circuit of claim 13, wherein the initialization driver comprises:

an NMOS transistor that includes a source connected to a ground voltage terminal, a drain connected to the first node, and a gate receiving the fuse sensing signal.

18. The semiconductor integrated circuit of claim 13, wherein the pulse generator comprises:

a second delayer configured to delay the fuse sensing signal by a second delay time and outputting a delayed signal;

a second inverter configured to receive an output signal of the second delayer;

a second NOR gate configured to receive an output signal of the second inverter and the fuse sensing signal; and a third inverter configured to receive an output signal of the second NOR gate and output the fuse sensing pulse.

19. The semiconductor integrated circuit of claim 13, wherein the pull-up driver comprises:

a second PMOS transistor that includes a source connected to a power source voltage terminal, a drain connected to the second node, and a gate receiving the fuse sensing pulse.

20. A method for driving a fuse circuit which includes a fuse connected between a first node and a second node, comprising:

pulling down a voltage of the first node in an initialization period;

pulling up a voltage of the second node during an initial first period of a fuse sensing period;

determining whether the fuse is blown or not in response to a voltage of the first node in the fuse sensing period;

driving the second node toward a voltage level lower than a pull-up voltage level of the second node after an initial second period of the fuse sensing period that includes the initial first period.

\* \* \* \* \*